(12) United States Patent
Chang

(10) Patent No.: US 6,750,667 B2
(45) Date of Patent: Jun. 15, 2004

(54) ADAPTING APPARATUS WITH DETECTING AND REPAIRING FUNCTIONS AND METHOD THEREOF

(75) Inventor: Kou-Yung Chang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/263,483

(22) Filed: Oct. 3, 2002

(65) Prior Publication Data
US 2003/0122562 A1 Jul. 3, 2003

(30) Foreign Application Priority Data
Dec. 28, 2001 (TW) .................................. 90132833 A

(51) Int. Cl.7 .............................................. G01R 31/02
(52) U.S. Cl. ...................... 324/758; 324/754; 324/158.1
(58) Field of Search .............................. 324/758, 754, 324/765, 763, 158.1; 439/66, 81; 361/760; 228/180.21, 180.22

(56) References Cited

U.S. PATENT DOCUMENTS 6,292,003 B1 * 9/2001 Fredrickson et al. ........ 324/754
6,400,173 B1 * 6/2002 Shimizu et al. ............. 324/765
6,420,888 B1 * 7/2002 Griffin et al. ............... 324/754
6,509,754 B2 * 1/2003 Lin et al. .................... 324/755

* cited by examiner

Primary Examiner—Kamand Cuneo
Assistant Examiner—Jimmy Nguyen
(74) Attorney, Agent, or Firm—Michael Best & Friedrich LLP

(57) ABSTRACT

An adapting apparatus for detecting and repairing an unworkable element mounted on a probe card having plural contacts is provided. The adapting apparatus includes: an adapting board having plural contact pins mounted on a lower side thereof and arranged corresponding to the plural contacts, a socket mounted on an upper side of the adapting board for plugging therein an integrated circuit element, and a fixer for fixing the adapting board and the probe card to make an electrical connection between the plural contact pins of the adapting board and the plural contacts of the probe card. The probe card is electrically connected with a test device and provides a test current through the test device. The test current is transmitted to the integrated circuit element and the unworkable element is specifically determined by the status of electric conduction.

19 Claims, 4 Drawing Sheets

ADAPTING APPARATUS WITH DETECTING AND REPAIRING FUNCTIONS AND METHOD THEREOF

FIELD OF THE INVENTION

The present invention is related to an adapting apparatus for detecting and repairing an unworkable element, and more particularly, to an adapting apparatus for detecting and repairing a probe card used for testing the quality of a wafer die.

BACKGROUND OF THE INVENTION

When developing a new testing program, generally a package (PKG) has to be used for debugging or testing in the load. However, the load will become a waste if the package is not tested, but only the wafer die in the manufacture process.

Presently, due to the product feature and the program needs of the square probe card, some components must be added on the probe card, for example, the relay, the resistance, and the integrated circuit (IC). Please refer to FIG. 1. FIG. 1 is a flowchart illustrating the conventional procedure to replace the component on the probe card for testing according to the prior art. First, the untested probe card is mounted on the prober and set up for testing. After tested, it seems that the probe card is damaged and the components on the probe card will be then checked. Afterwards, the probe card is dismounted from the prober for replacing the unworkable component. The probe card will be re-mounted on the prober and re-set up for testing after the unworkable component is replaced. Then, the contact status between a wafer die and the probe card is used for testing the probe card. If the testing result is erroneous, the probe card must be repeatedly dismounted from the prober and re-set up for testing as the procedure shown in FIG. 1 until the testing result is completely correct. In other words, the conventional technique has the following drawbacks:

1. When the probe card is not workable (probably one or more than one components are broken), a wafer die must be used for repairing the probe card.

2. It needs re-setup for each probe card when repairing, which extremely wastes time.

3. When one of the components needs to be replaced, the probe card must be dismounted from the prober. After the component is replaced, the probe card needs to be re-setup for testing.

4. If the component replaced in the first time is not completely repaired or another component is found damaged, it is then required to replace the component again, which means the procedure including the setup step must be repeatedly proceeded again.

From the above description, it is known that the it might have to reset up the prober many times to repair one probe card, which is very inconvenient and wastes time. Besides, since a wafer die is required for testing, there must be some pin scars left on the wafer die, which might damage the wafer die and make it unusable.

In order to overcome the drawbacks in the prior art, an adapting apparatus for detecting and repairing a probe card is provided, which is able to detect and repair the unworkable element on the probe card.

SUMMARY OF THE INVENTION

The main purpose of the present invention is to provide an adapting apparatus for electrically connecting with the plural contacts of the probe card by the contact pins of the adapting board. In such way, the probe card is not required to contact with the wafer die directly when tested so that the consumption of wafer die can be prevented.

It is one object of the present invention to provide an adapting apparatus for detecting and repairing an unworkable element mounted on the probe card. When the probe card needs to be repaired, it is not required to re-set up the probe card for testing. Therefore, not only the repairing time is saved, but also the prober is occupied with less time, which will largely lower the cost for repairing the probe card.

It is another object of the present invention to provide an adapting apparatus for detecting and repairing the probe card so that the load is not needed for debugging when developing a new program and the cost for the load can be largely saved.

According to one aspect of the present invention, an adapting apparatus for detecting and repairing an unworkable element mounted on a probe card having plural contacts, comprises: an adapting board having plural contact pins mounted on a lower side thereof and arranged correspondingly to the plural contacts, a socket mounted on an upper side of the adapting board for plugging therein an integrated circuit element, and a fixer for fixing the adapting board and the probe card to make an electrical connection between the plural contact pins of the adapting board and the plural contacts of the probe card.

In accordance with the present invention, the probe card is electrically connected with a test device and provides a test current through the test device.

Preferably, the test current is transmitted to the integrated circuit element via the adapting board.

Preferably, the unworkable element is specifically determined from a status of electric conduction between the plural contact of the probe card and the integrated circuit element.

Preferably, the probe card is used for testing a quality of a wafer die.

Preferably, the unworkable element is selected from a group consisted of a relay, a resistance, an integrated circuit, and a combination thereof.

Preferably, the plural contact pins are plural Pogo pins.

Preferably, the plural contacts are plural welded points.

Preferably, the fixer further comprises two clamping portions for simultaneously fixing two sides of the adapting board and the probe card.

Preferably, the clamping portion is U-shaped.

Preferably, the unworkable element is replaced with a workable one after detected.

According to another aspect of the present invention, a method of detecting and repairing an unworkable element mounted on a probe card having a first terminal by an adapting apparatus having a second terminal and a socket, comprises the steps of: (a) providing the adapting apparatus for connecting with the probe card, wherein the second terminal is mounted on an adapting board and arranged correspondingly to the first terminal of the probe card, and the socket is mounted on an upper side of the adapting board, (b) plugging an integrated circuit element into the socket, (c) fixing the adapting board and the probe card so as to make an electrical connection between the second terminal of the adapting board and the first terminal of the probe card, (d) introducing a test current to the integrated circuit element via the adapting board, (e) observing a status of electric conduction between the first terminal of the probe card and the integrated circuit element, and (f) determining the unworkable element according to the status of electric conduction and executing a repairing process.

In accordance with the present invention, the probe card is used for testing a quality of a wafer die.

Preferably, the unworkable element is selected from a group consisted of a relay, a resistance, an integrated circuit, and a combination thereof.

Preferably, the second terminal is plural Pogo pins.

Preferably, the first terminal is plural welded points.

Preferably, the fixer further comprises two clamping portions for simultaneously fixing two sides of the adapting board and the probe card.

Preferably, the clamping portion is U-shaped.

Preferably, the unworkable element is replaced with a workable one after detected.

According to another aspect of the present invention, an adapting apparatus for detecting and repairing an unworkable element mounted on a probe card having plural contacts, comprises: a substitute circuit device having plural contact pins arranged corresponding to the plural contacts for electrically connecting with the probe board through the plural contact pins thereof, and a fixer for fixing the adapting board and the probe card to make an electrical connection between the plural contact pins of the substitute circuit device and the plural contacts of the probe card.

In accordance with the present invention, the substitute circuit device further comprises: an adapting board having plural contact pins mounted on a lower side of the adapting board and arranged corresponding to the plural contacts of the probe card, and a socket mounted on an upper side of the adapting board for plugging therein an integrated circuit element so as to have an electrical connection with the probe card.

The foregoing and other features and advantages of the present invention will be more clearly understood through the following descriptions with reference to the drawings, wherein:

DETAILED DESCRIPTION OF THE PREFERRED EMBODIMENT

Figure 1:
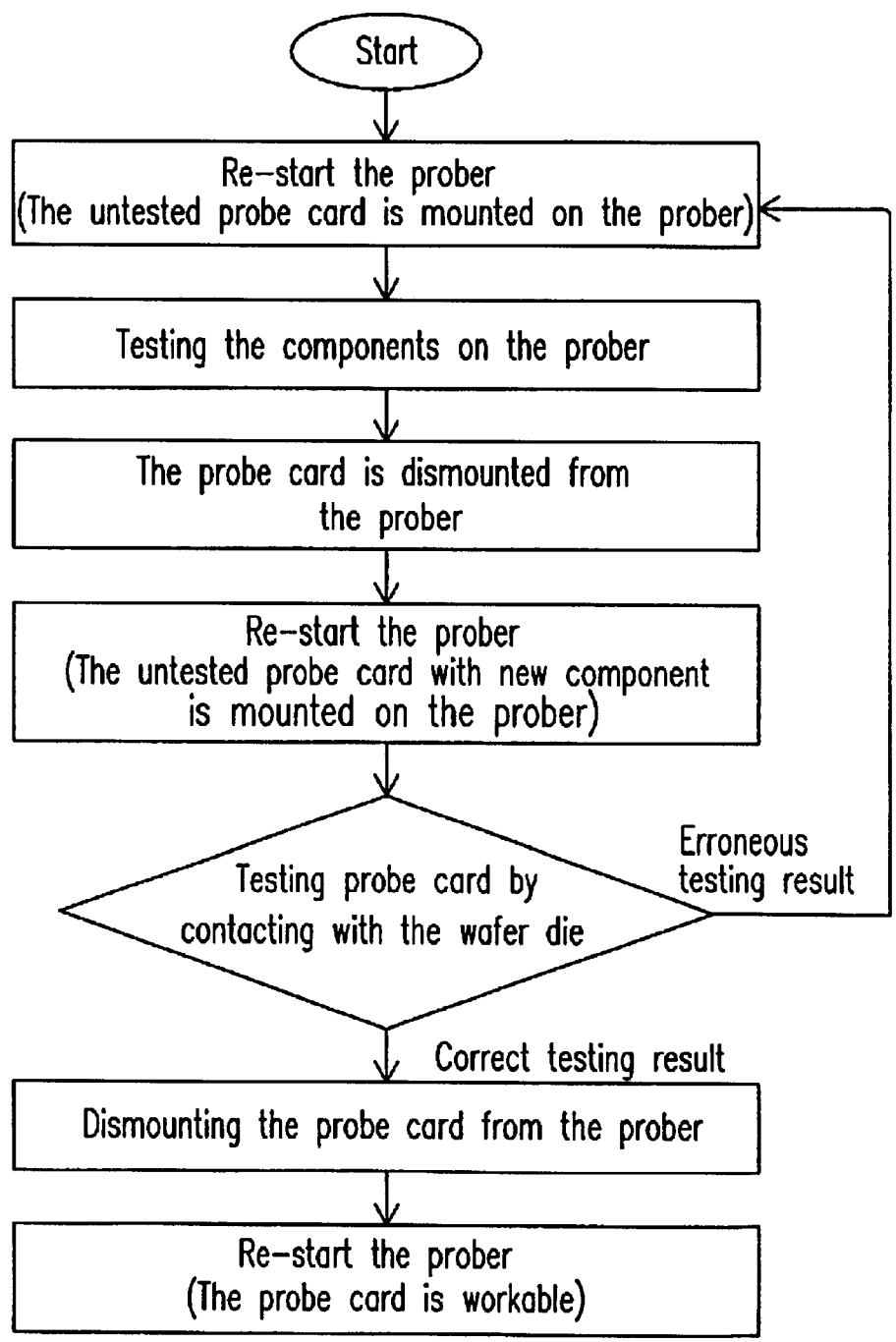
FIG. 1 is a flowchart illustrating the conventional procedure to replace the component on the probe card for testing according to the prior art.
Figure 2A:
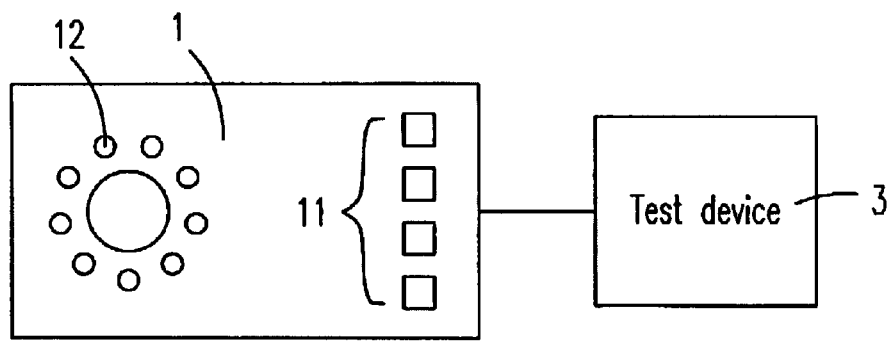
FIG. 2(a) is a diagram illustrating the structure of the probe card electrically connected with the test device according to a preferred embodiment of the present invention.
Figure 2B:
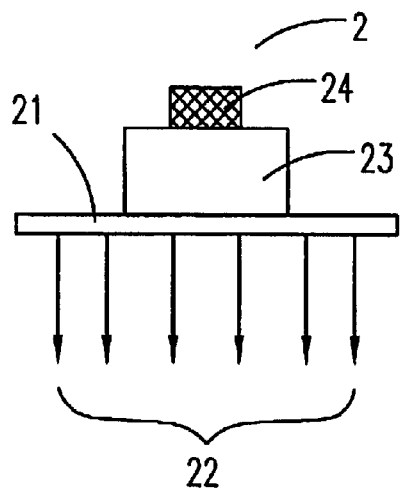
FIG. 2(b) is a diagram illustrating the structure of the substitute circuit device having plural contact pins for electrically connecting with the probe card according to a preferred embodiment of the present invention.
Figure 2C:
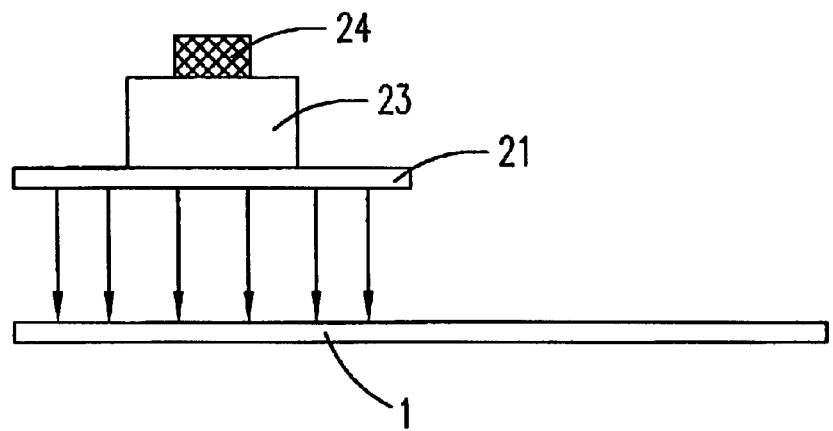
FIG. 2(c) is a diagram illustrating the structure of the substitute circuit device electrically connected with the probe card according to a preferred embodiment of the present invention.

The present invention will now described more specifically with reference to the following embodiments. Please refer to FIG. 2(a). FIG. 2(a) is a diagram illustrating the structure of the probe card electrically connected with the test device according to a preferred embodiment of the present invention. The probe card 1 is usually used for testing the quality of a wafer die. The adapting apparatus with the detecting and repairing functions provided in the present invention is used to detect and repair the unworkable components 11 mounted on the probe card 1. The unworkable component could be a relay, or a resistance, or an integrated circuit, or the combination thereof. The probe card is electrically connected with the test device 3 and provides a test current through the test device. Please refer to FIGS. 2(b)–(c). FIG. 2(b) is a diagram illustrating the structure of the substitute circuit device having plural contact pins for electrically connecting with the probe card according to a preferred embodiment of the present invention. FIG. 2(c) is a diagram illustrating the structure of the substitute circuit device electrically connected with the probe card according to a preferred embodiment of the present invention. The substitute circuit device 2 includes an adapting board 21 and a socket 23. The adapting board 21 has plural contact pins 22 mounted on a lower side of the adapting board 21 and arranged corresponding to the plural contacts 12 of the probe card 1 (As shown in FIG. 2(a)). As a matter of fact, the plural contact pins mounted on a lower side of the adapting board 21 are plural Pogo pins, while the plural contacts of the probe card 1 are plural welded points. The socket 23 is mounted on an upper side of the adapting board 21 for plugging therein an integrated circuit 24 so as to have an electrical connection with the probe card 1.

Figure 2D:
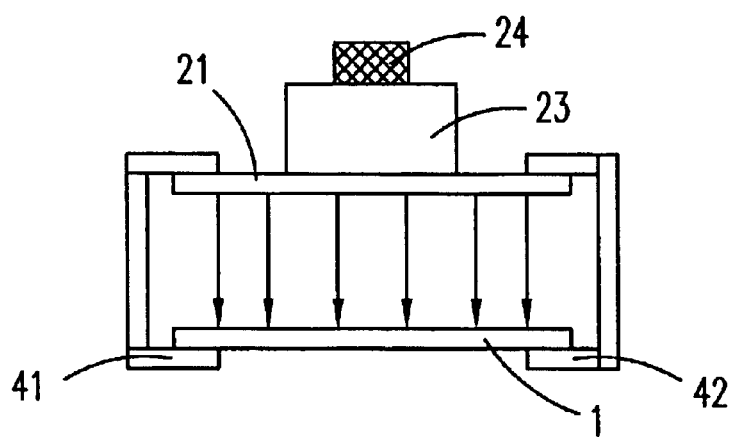
FIG. 2(d) is a diagram illustrating the structure of the adapting apparatus with the detecting and repairing functions according to a preferred embodiment of the present invention.

Please refer to FIG. 2(d). FIG. 2(d) is a diagram illustrating the structure of the adapting apparatus with the detecting and repairing functions according to a preferred embodiment of the present invention. The adapting apparatus includes the substitute circuit device 2 and the fixer 41 and 42. The fixer 41 or 42 further comprises two clamping portions for simultaneously fixing two sides of the adapting board 21 and the probe card 1. When the adapting board 21 and the probe card 1 are fixed by the fixers 41 and 42, the electrical connection between the plural contact pins 22 of the adapting board 21 and the plural contacts 12 of the probe card 1 is made. The test current is then introduced to the integrated circuit 24 via the probe card 1 and the adapting board 21. Since the integrated circuit 24 has plural pins, the status of electric conduction between the plural contacts 12 of the probe card 1 and the plural pins of the integrated circuit 24 is observed. The unworkable element 11 is determined according to the status of electric conduction and then replaced with a new one.

Figure 3:
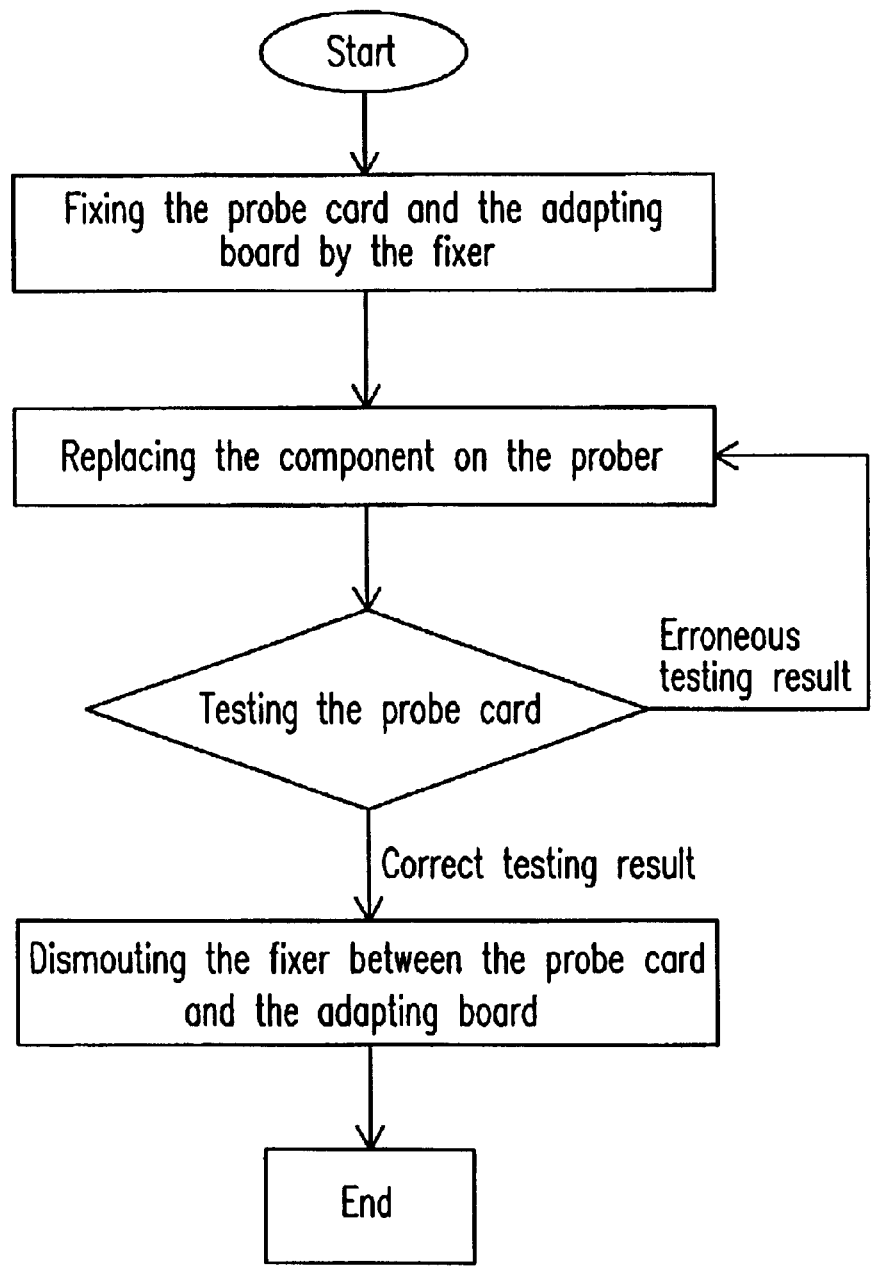
FIG. 3 is a flowchart illustrating the procedure to replace the component on the probe card for testing according to a preferred embodiment of the present invention.

Please refer to FIG. 3. FIG. 3 is a flowchart illustrating the procedure to replace the component on the probe card for testing according to a preferred embodiment of the present invention. First, the tested probe card and the adapting board is fixed by the fixer. The test process is proceeded via the test device and the unworkable component is directly replaced while the probe card is still mounted on the prober. The probe card is then tested right away. If the test result is erroneous, the process of testing the component of the probe card has to be repeated. On the contrary, if the test result is correct, the fixer fixing the tested probe card and the adapting board is then dismounted and the whole detection and the repairing procedure is accomplished.

From the above description, it is known that the adapting apparatus provided in the present invention uses the contact pins of the adapting board to have a direct electrical connection with the probe card. In such method, the probe card is not required to contact with the wafer die directly, and the cost for the consumption of wafer die can be largely lowered. In addition, the complex and time-wasting step of re-setup is no longer needed. Not only the repairing time is saved, but also the prober is occupied with less time, which will largely lower the cost for repairing the probe card. That is, the adapting apparatus provided in the present invention is able to replace the conventional testing method of using the wafer die for testing and to repair the probe card with a short time. Therefore, the present invention fits the requirement in the industry and possesses the industrial applicability.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of detecting and repairing an unworkable element mounted on a probe card having a first terminal by an adapting apparatus having a second terminal and a socket, comprising steps of:

(a) providing said adapting apparatus for connecting with said probe card, wherein said second terminal is mounted on an adapting board and arranged corresponding to said first terminal of said probe card, and said socket is mounted on an upper side of said adapting board;

(b) plugging an integrated circuit element into said socket;

(c) fixing said adapting board and said probe card so as to make an electrical connection between said second terminal of said adapting board and said first terminal of said probe card;

(d) introducing a test current to said integrated circuit element via said adapting board;

(e) observing a status of electric conduction between said first terminal of said probe card and said integrated circuit element; and (f) determining said unworkable element according to said status of electric conduction and executing a repairing process.

2. The method according to claim 1, wherein said probe card is used for testing a quality of a wafer die.

3. The method according to claim 1, wherein said unworkable element is selected from a group consisted of a relay, a resistance, an integrated circuit, and a combination thereof.

4. The method according to claim 1, wherein said second terminal is plural Pogo pins.

5. The method according to claim 1, wherein said first terminal is plural welded points.

6. The method according to claim 1, wherein said fixer further comprises two clamping portions for simultaneously fixing two sides of said adapting board and said probe card.

7. The method according to claim 6, wherein said clamping portion is U-shaped.

8. The method according to claim 1, wherein said unworkable element is replaced with a workable one after detected.

9. An adapting apparatus for detecting and repairing an unworkable element mounted on a probe card having plural contacts, comprising:

an adapting board having plural contact pins mounted on a lower side thereof and arranged corresponding to said plural contacts;

a socket mounted on an upper side of said adapting board for plugging therein an integrated circuit element; and a fixer for fixing said adapting board and said probe card to make an electrical connection between said plural contact pins of said adapting board and said plural contacts of said probe card.

10. The adapting apparatus according to claim 9, wherein said probe card is electrically connected with a test device and provides a test current through said test device.

11. The adapting apparatus according to claim 10, wherein said test current is transmitted to said integrated circuit element via said adapting board.

12. The adapting apparatus according to claim 9, wherein said unworkable element is specifically determined from a status of electric conduction between said plural contact of said probe card and said integrated circuit element.

13. The adapting apparatus according to claim 9, wherein said probe card is used for testing a quality of a wafer die.

14. The adapting apparatus according to claim 9, wherein said unworkable element is selected from a group consisted of a relay, a resistance, an integrated circuit, and a combination thereof.

15. The adapting apparatus according to claim 9, wherein said plural contact pins are plural Pogo pins.

16. The adapting apparatus according to claim 9, wherein said plural contacts are plural welded points.

17. The adapting apparatus according to claim 9, wherein said fixer further comprises two clamping portions for simultaneously fixing two sides of said adapting board and said probe card.

18. The adapting apparatus according to claim 17, wherein said clamping portion is U-shaped.

19. The adapting apparatus according to claim 9, wherein said unworkable element is replaced with a workable one after detected.

* * * * *